(12) United States Patent
Chen

(10) Patent No.: US 7,744,996 B2
(45) Date of Patent: Jun. 29, 2010

(54) ADHESIVE STRUCTURE AND METHOD FOR MANUFACTURING THE SAME

(75) Inventor: Chih-Chia Chen, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 276 days.

(21) Appl. No.: 11/758,280

(22) Filed: Jun. 5, 2007

(65) Prior Publication Data

US 2007/0227671 A1    Oct. 4, 2007

(30) Foreign Application Priority Data

Jan. 26, 2007    (TW) .............................. 96103035 A

(51) Int. Cl.
*B32B 15/04* (2006.01)
*G02F 1/1345* (2006.01)
*H01L 23/58* (2006.01)

(52) U.S. Cl. ...................... 428/352; 349/149; 349/150; 257/638; 257/642

(58) Field of Classification Search ................. 428/209, 428/41.8, 352; 349/149–150; 257/638–642
See application file for complete search history.

(56) References Cited

U.S. PATENT DOCUMENTS

| | | | |
|---|---|---|---|
| 5,679,493 A | 10/1997 | Kai | |
| 6,031,590 A | 2/2000 | Kim | |
| 6,245,175 B1 | 6/2001 | Mochizuki | |
| 2006/0065995 A1 | 3/2006 | Masaki et al. | |

FOREIGN PATENT DOCUMENTS

| | | |
|---|---|---|
| CN | 1111926 | 11/1995 |
| JP | 11329542 | 11/1999 |
| JP | 2004006793 | 1/2004 |
| JP | 2006-93020 | 4/2006 |
| TW | 00406207 | 9/2000 |

OTHER PUBLICATIONS

English language translation of abstract of JP 2004006793.
English language translation of abstract of JP 11329542.
English language translation of abstract of TW 00406207.
Chinese language office action dated Mar. 28, 2008.

*Primary Examiner*—Cathy Lam
(74) *Attorney, Agent, or Firm*—Thomas, Kayden, Horstemeyer & Risley

(57) ABSTRACT

An adhesive structure for use in a liquid crystal display (LCD) and a method for manufacturing the adhesive structure are provided. The adhesive structure includes a releasing paper which is provided with two anisotropic conductive films (ACFs) thereon. When the adhesive structure is attached onto the LCD, the two ACFs can be simultaneously attached onto the glass substrate of the LCD for connecting the integrated circuit and flexible printed circuit, respectively.

10 Claims, 5 Drawing Sheets

ADHESIVE STRUCTURE AND METHOD FOR MANUFACTURING THE SAME

This application claims benefits from the priority of Taiwan Patent Application No. 096103035, filed Jan. 26, 2007, the disclosure of which is incorporated by reference herein in its entirety.

CROSS-REFERENCES TO RELATED APPLICATIONS

Not applicable.

BACKGROUND OF THE INVENTION

1. Field of the Invention

The present invention relates to an adhesive structure and a method for manufacturing the structure. In particular, the invention relates to an adhesive structure with anisotropic conductive films (ACFs) for use in a liquid crystal display (LCD), and a method for manufacturing the structure.

2. Descriptions of the Related Art

Liquid crystal displays (LCDs) have become increasingly popular because they are not only less power consumption and lower radiation, but also lightweight and portable. In manufacturing LCDs, the panel is first formed, followed by a module assembly process to produce the final product.

In the module assembly process, one of the main steps is to bond the integrated circuit (IC) and the flexible printed circuit (FPC) onto the outer lead bonding (OLB) area of the panel (or glass substrate), so as to electrically connect the electrodes or circuits which were previously formed on the panel.

The integrated circuits can be bonded onto the panel using the so-called "chip on glass (COG)" manufacturing process. In the COG process, the bumps of the integrated circuit are bonded onto the electrodes of the panel by metallic connection, such as welding. Nevertheless, although welding can result in high conductivity, it may damage the components due to the high temperature. Because manufacturing technologies have progressively advanced, the components have not only become progressively minimized, but the distances between the bumps of the integrated circuit or between the pins of the flexible printed circuit have also gradually decreased. Thus, the metallic connection will easily short the circuit in the manufacturing processes, resulting in lower yield.

Presently, an anisotropic conductive film (ACF) is used for electrically conducting and connecting the integrated circuits or the flexible printed circuits to the panel. The anisotropic conductive film mainly comprises conductive particles and an isolation adhesive material. Generally, the anisotropic conductive film is manufactured into a roll tap, and thus, a portion of which will be needed is appropriately cut. In practice, the cover film on the anisotropic conductive film must be removed first. Then, the anisotropic conductive film is attached onto the panel, where the base file on the other side of the anisotropic conductive film is removed subsequently. After precisely positioning the film, the integrated circuit or the flexible printed circuit is bonded with pressure at a specific temperature and period. Thus, the isolation adhesive material will solidify to provide perpendicular conduction, lateral isolation and adhesive connection.

The outer lead bonding area on the panel 10 of a conventional LCD is shown in FIG. 1. The outer lead bonding area comprises two regions, where the first anisotropic conductive film 11 and the second anisotropic conductive film 13 are attached onto the two regions, respectively, during the manufacturing processes. Then, the integrated circuit 15 and the flexible printed circuit 17 can be disposed onto the regions, respectively, for bonding with pressure. Because the integrated circuit 15 and the flexible printed circuit 17 are formed with different materials, different anisotropic conductive films should be adopted. Thus, different roll taps will be applied in the manufacturing processes. Accordingly, the integrated circuit 15 and the flexible printed circuit 17 can electrically conduct with the circuits or electrodes on the panel 10 through the first anisotropic conductive film 11 and the second anisotropic conductive film 13, respectively.

However, this conventional manufacturing process requires that the first anisotropic conductive film 11 and the second anisotropic conductive film 13 be attached onto the panel sequentially. In other words, requiring two attaching steps greatly complicates the manufacturing processes. Moreover, for the attaching precisions of the films between the integrated circuit 15 and the flexible printed circuit 17 and the regions, some space needs to be reserved to prevent improper connection or bonding damages. In particular, the distance D1 between the integrated circuit 15 and the flexible printed circuit 17 may range approximately from 0.45 mm to 0.5 mm.

Given the above concerns, the conventional manufacturing processes result in undesirable complications. In panel design, the outer lead bonding area tends to be minimized for enlarging the scale of the display area or minimizing the size of the final product. Thus, an improved adhesive structure for simultaneously attaching the anisotropic conductive films onto the panel of the LCD is needed.

SUMMARY OF THE INVENTION

One object of the present invention is to provide an adhesive structure and a method for manufacturing the structure. The adhesive structure which comprises anisotropic conductive films is adapted in the manufacturing process for an LCD. In one step of attachment, both anisotropic conductive films can be applied onto the panel simultaneously, and thus, the manufacturing process can be effectively simplified.

Another object of the present invention is to provide an adhesive structure and a method for manufacturing the structure. Two anisotropic conductive films, which are previously formed on releasing paper, can be applied at the same time. Thus, it is no longer necessary for there to be space reserved in the case that the attachment is inaccurate. As a result, the distance between the integrated circuit and the flexible printed circuit can be shortened. Therefore, the outer lead bonding area will not need to be as large in area for applying the adhesive structure of the present invention, thereby minimizing the size of the LCD.

Still another object of this invention is to provide an adhesive structure and a method for manufacturing the structure. Because the adhesive structure simultaneously attaches two anisotropic conductive films onto the panel, the following bonding step applied to the integrated circuit and the flexible printed circuit can be implemented at the same time. Certainly, the manufacturing processes can be further minimized.

To achieve the abovementioned objects, an adhesive structure for use in manufacturing an LCD is disclosed in the present invention. The adhesive structure comprises a releasing paper, a first anisotropic conductive film and a second anisotropic conductive film wherein the first anisotropic conductive film and the second anisotropic conductive film are formed on the first area and the second area of the releasing paper, respectively. When the adhesive structure attaches onto the panel of the LCD, the first anisotropic conductive film is adapted to adhere onto the integrated circuit bonding area of the panel, while the second anisotropic conductive film is adapted to adhere onto the flexible printed circuit bonding area of the panel.

Another aspect of the present invention is directed to a method for manufacturing the aforesaid adhesive structure. Firstly, the first area and second area can be defined on the surface of the releasing paper, so that the first anisotropic conductive film and the second anisotropic conductive film are applied onto the first area and the second area, respectively. For manufacturing the first anisotropic conductive film and the second anisotropic conductive film, the materials can be independently prepared in two adjacent containers first. The releasing paper can then be applied onto the first anisotropic conductive film and the second anisotropic conductive film. After the two containers are removed, the first anisotropic conductive film and the second anisotropic conductive film that were attached on the releasing paper can be exposed.

The detailed technology and preferred embodiments implemented for the subject invention are described in the following paragraphs in connection with the accompanied drawings for people skilled in this field to well appreciate the features of the present invention.

DESCRIPTION OF THE PREFERRED EMBODIMENT

Figure 1:
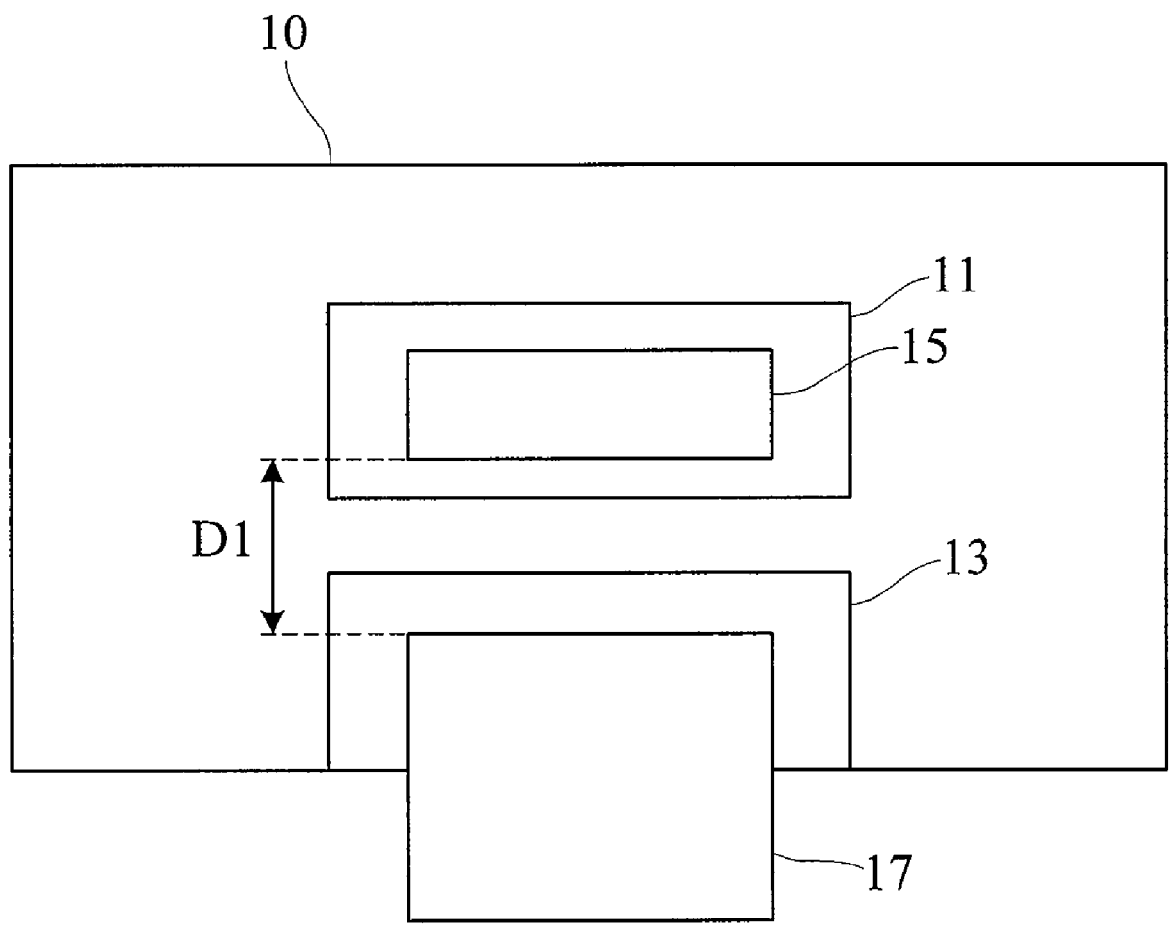
FIG. 1 is a schematic view illustrating the outer lead bonding (OLB) area on the panel of a conventional LCD.
Figure 2:
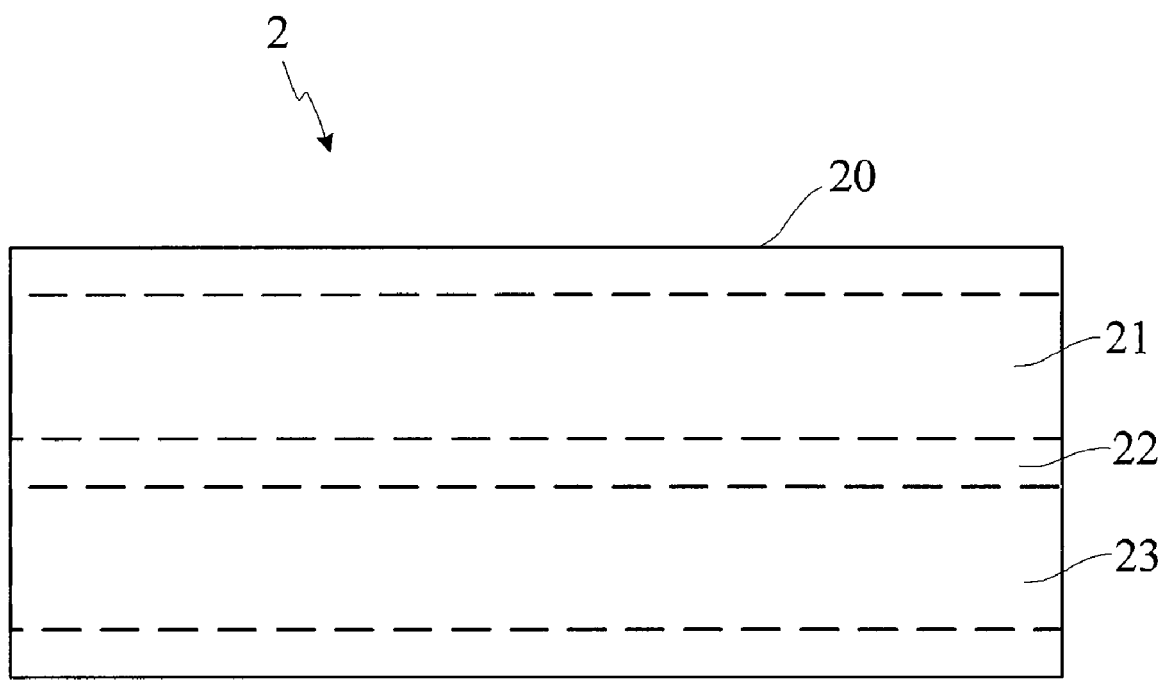
FIG. 2 is a schematic view illustrating the adhesive structure, according to one embodiment of the present invention.
Figure 3:
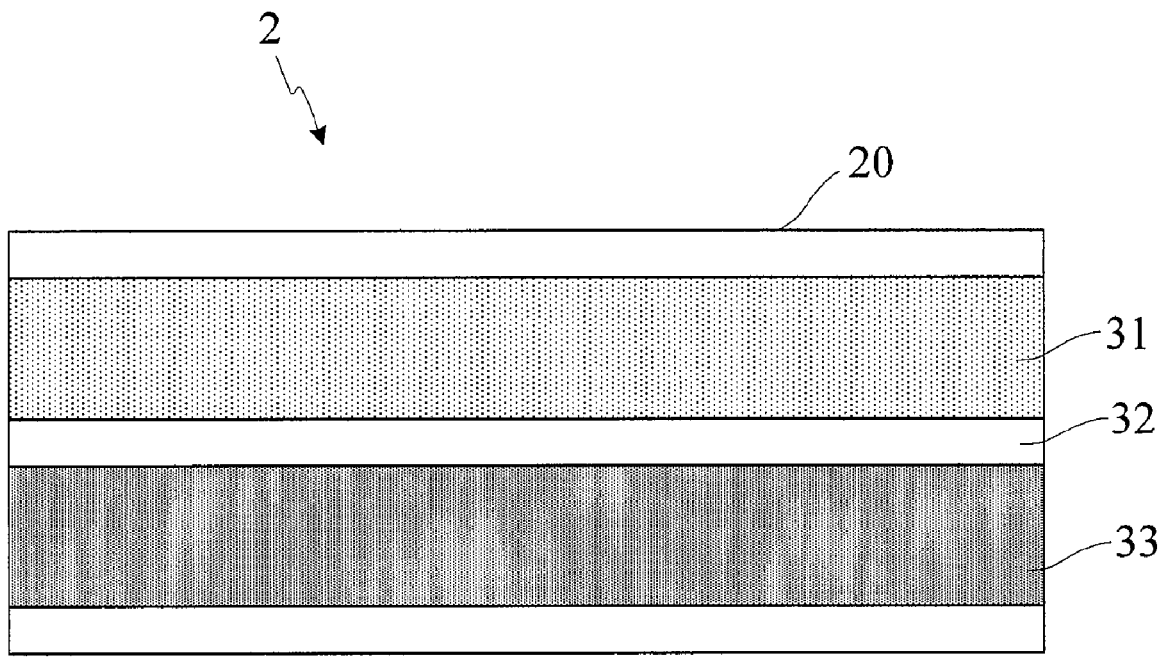
FIG. 3 is a schematic view further illustrating the adhesive structure in FIG. 2.

A preferable embodiment of the adhesive structure 2 of the present invention is shown in FIG. 2 and FIG. 3. The adhesive structure 2 comprises a releasing paper 20. For illustration convenience, the first area 21 and second area 23 can be defined on the surface of the releasing paper 20. In this embodiment, an intermediate area 22 is further defined between the first area 21 and the second area 22.

As shown in FIG. 3, the first anisotropic conductive film 31 and second anisotropic conductive film 33 can be formed on the first area 21 and the second area 23, respectively. Thus, an interval is formed between the first anisotropic conductive film 31 and the second anisotropic conductive film 33. Preferably, an adhesive layer 32 is formed on the intermediate area 22 and between the first anisotropic conductive film 31 and the second anisotropic conductive film 33, for partially adhering to the first anisotropic conductive film 31 and the second anisotropic conductive film 33. The adhesive layer 32 is non-conductive and helps keep the first anisotropic conductive film 31 and the second anisotropic conductive film 33 oppositely disposed. That is, the adhesive layer 32 will aid in a successful application of the adhesive structure 2.

Figure 4:
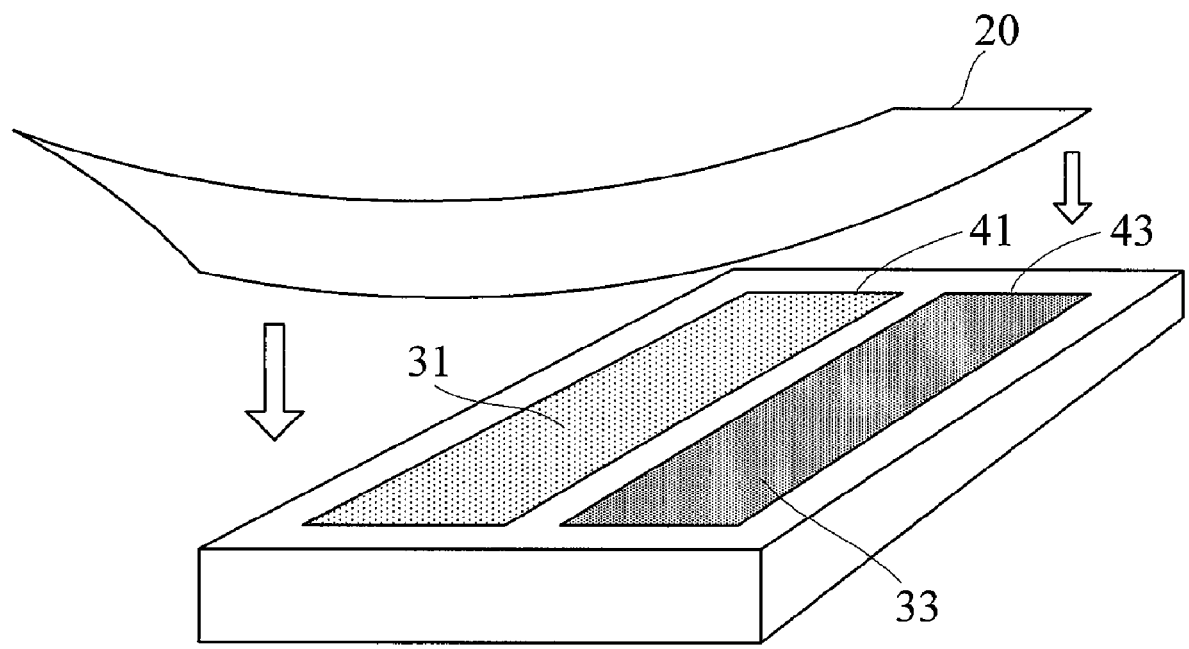
FIG. 4 is a schematic view illustrating the process of forming the adhesive structure, according to one embodiment of the present invention.

It is noted that there are various manners for preparing the first anisotropic conductive film 31 and the second anisotropic conductive film 33 on the releasing paper 20. For example, the anisotropic conductive films can be independently disposed onto the specific areas using particular manufacturing equipments. A preferable method for manufacturing the adhesive structure 2 is exemplarily illustrated in FIG. 4, which may help reduce manufacturing costs. First, the first anisotropic conductive film 31 and the second anisotropic conductive film 33 can be independently prepared in two adjacent containers 41, 43. Particularly, isolation adhesive materials can be disposed into the containers 41, 43 where particular conductive particles are appropriately applied therein. Subsequently, as shown by the arrows in FIG. 4, the releasing paper 20 can be applied onto the first anisotropic conductive film 31 and the second anisotropic conductive film 33. After the containers 41, 43 are removed, the first anisotropic conductive film 31 and the second anisotropic conductive film 33 adhered onto the releasing paper 20 can be exposed, as shown in FIG. 3. Certainly, the adhesive layer 32 is then applied between the first anisotropic conductive film 31 and the second anisotropic conductive film 33.

Figure 5:
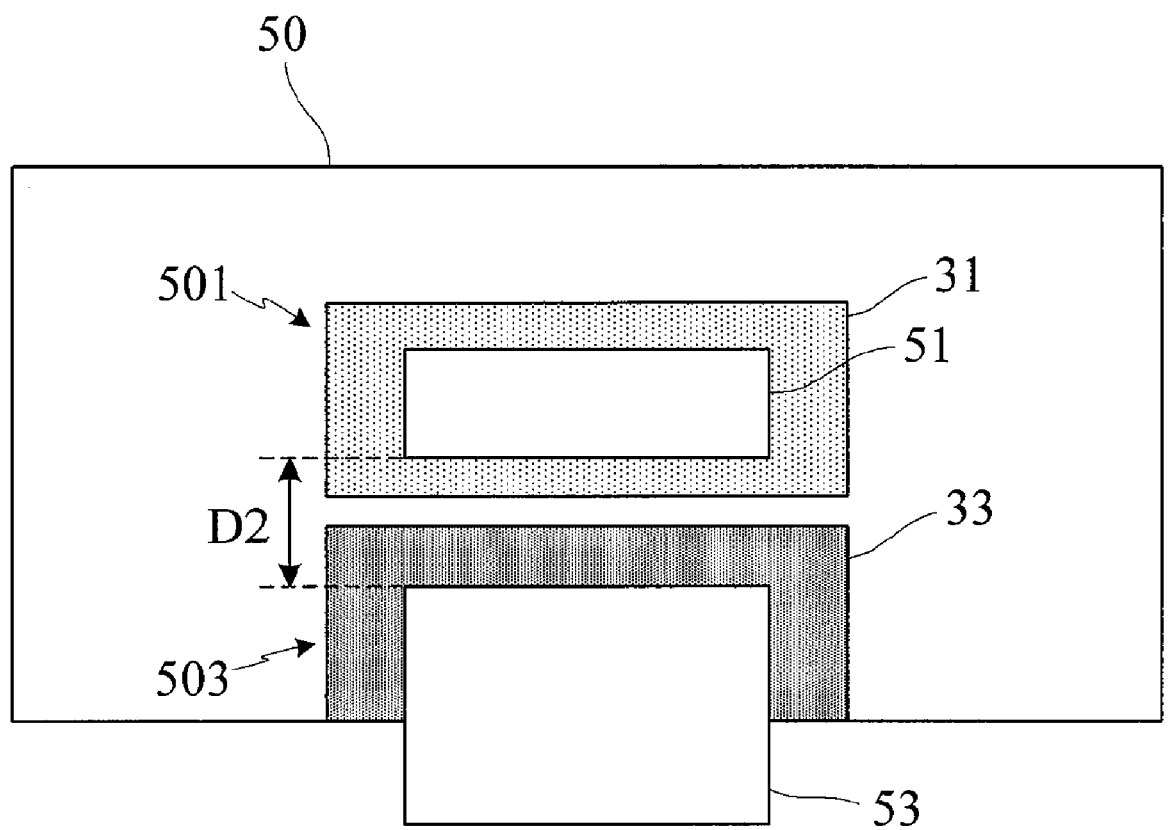
FIG. 5 is a schematic view illustrating the adhesive structure, according to one embodiment of the present invention.

The completed adhesive structure 2 can be added to the process of manufacturing LCDs. As shown in FIG. 5, the LCD comprises a panel 50 on which the outer lead bonding (OLB) area comprising the integrated circuit bonding area 501 and flexible printed circuit bonding area 503 is disposed. When the adhesive structure 2 adheres onto the panel 50, the first anisotropic conductive film 31 is adapted to adhere onto the integrated circuit bonding area 501. Simultaneously, the second anisotropic conductive film 33 is adapted to adhere onto the flexible printed circuit bonding area 503. A roller can be adopted to strip the releasing paper 20 off. Thus, the first anisotropic conductive film 31 has an adhesive surface adapted to electrically connect with the integrated circuit 51. Similarly, the second anisotropic conductive film 33 has an adhesive surface adapted to electrically connect with the flexible printed circuit 53. After bonding at a certain temperature, pressure and period, the bonding process for connecting the integrated circuit 51 and the flexible printed circuit 53 is accomplished.

It is noted that the integrated circuit 51 and the flexible printed circuit 53 are made of different materials, and thus, the first anisotropic conductive film 31 and the second anisotropic conductive film 33 should also be different to achieve better attachment and electrical conduction. Specifically, the first anisotropic conductive film 31 has a first adhesive material and a plurality of first conductive particles formed therein, while the second anisotropic conductive film 33 has a second adhesive material and a plurality of second conductive particles formed therein. The first adhesive material is adapted, but not limited, to adhere to gold, silicon or glass. Likewise, the second adhesive material is adapted to adhere to polyimide (PI), glass, or epoxy resin.

It is understandable that an interval can be reserved between the first anisotropic conductive film 31 and the second anisotropic conductive film 33 for exposing the intermediate area 22 without disposing the adhesive layer 32. Another embodiment could have the first anisotropic conductive film 31 and the second anisotropic conductive film 33 adjacently connected with each other to achieve the objectives of the present invention.

According to the abovementioned disclosures, the adhesive structure of the present invention can simultaneously form two anisotropic conductive films onto the panel for simplifying the manufacturing process. Moreover, as shown in FIG. 5, the distance D2 between the integrated circuit and the flexible printed circuit can be shortened, for example, to a distance ranging from 0.2 mm to 0.3 mm. The size of the panel can be minimized and thus, provide a more competitive LCD product.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An adhesive structure, comprising:
   a releasing paper having a first area, a second area and an intermediate area between the first area and the second area thereon;
   a first anisotropic conductive film formed on the first area;
   a second anisotropic conductive film formed on the second area; and
   an adhesive layer formed on the intermediate area for partially adhering to the first anisotropic conductive film and the second anisotropic conductive film, wherein the adhesive layer is non-conductive.

2. The adhesive structure as claimed in claim 1, wherein the first anisotropic conductive film and the second anisotropic conductive film are adapted to form an interval for the adhesive layer being disposed therebetween.

3. The adhesive structure as claimed in claim 1, wherein the first anisotropic conductive film comprises a first adhesive material and a plurality of first conductive particles formed in the first adhesive material, and wherein the second anisotropic conductive film comprises a second adhesive material and a plurality of second conductive particles formed in the second adhesive material.

4. The adhesive structure as claimed in claim 3, wherein the first adhesive material is adapted to adhere to gold, silicon, glass or combinations thereof, and the second adhesive material is adapted to adhere to polyimide, glass, epoxy resin or combinations thereof.

5. An adhesive structure for use in a process for manufacturing a liquid crystal display which comprises a panel, the panel including an integrated circuit bonding area and a flexible printed circuit bonding area, the adhesive structure comprising:
   a releasing paper having a first area, a second area and an intermediate area between the first area and the second area thereon;
   a first anisotropic conductive film formed on the first area of the releasing paper, wherein the first anisotropic conductive film is adapted to adhere onto the integrated circuit bonding area;
   a second anisotropic conductive film formed on the second area of the releasing paper, wherein the second anisotropic conductive film is adapted to adhere onto the flexible printed circuit bonding area; and
   an adhesive layer formed on the intermediate area for partially adhering to the first anisotropic conductive film and the second anisotropic conductive film, wherein the adhesive layer is non-conductive.

6. The adhesive structure as claimed in claim 5, wherein the first anisotropic conductive film and the second anisotropic conductive film are adapted to form an interval for the adhesive layer being disposed therebetween.

7. The adhesive structure as claimed in claim 5, wherein the first anisotropic conductive film having an adhesive surface which corresponds to the integrated circuit bonding area is adapted to electrically connect with an integrated circuit, and the second anisotropic conductive film having an adhesive surface which corresponds to the flexible printed circuit bonding area is adapted to electrically connect with a flexible printed circuit.

8. The adhesive structure as claimed in claim 7, wherein the first anisotropic conductive film comprises a first adhesive material and a plurality of first conductive particles formed in the first adhesive material, and wherein the second anisotropic conductive film comprises a second adhesive material and a plurality of second conductive particles formed in the second adhesive material.

9. The adhesive structure as claimed in claim 8, wherein the first adhesive material is adapted to adhere to gold, silicon, glass or combinations thereof, and the second adhesive material is adapted to adhere to polyimide, glass, epoxy resin or combinations thereof.

10. A method for manufacturing an adhesive structure, comprising:
    providing a releasing paper having a first area, a second area and an intermediate area between the first area and the second area on a surface thereof;
    applying a first anisotropic conductive film and a second anisotropic conductive film onto the first area and the second area, respectively; and
    forming an adhesive layer on the intermediate area of the releasing paper, for adhering to the first an isotropic conductive film and the second anisotropic conductive film, wherein the adhesive layer is non-conductive.

* * * * *